(12) United States Patent
Lin et al.

(10) Patent No.: US 10,912,207 B1
(45) Date of Patent: Feb. 2, 2021

(54) DISPLAY APPARATUS

(71) Applicant: Top Victory Investments Limited, Hong Kong (HK)

(72) Inventors: Yi-Sheng Lin, New Taipei (TW); Chia-Yu Liu, New Taipei (TW)

(73) Assignee: TOP VICTORY INVESTMENTS LIMITED, Hong Kong (HK)

( * ) Notice: Subject to any disclaimer, the term of this patent is extended or adjusted under 35 U.S.C. 154(b) by 0 days.

(21) Appl. No.: 16/839,747

(22) Filed: Apr. 3, 2020

(30) Foreign Application Priority Data

Dec. 16, 2019 (TW) .............................. 108145986 A

(51) Int. Cl.
*F16M 11/00* (2006.01)
*H05K 5/00* (2006.01)
*H05K 5/02* (2006.01)
*G06F 1/16* (2006.01)

(52) U.S. Cl.
CPC ......... *H05K 5/0017* (2013.01); *G06F 1/1601* (2013.01); *H05K 5/0234* (2013.01); *G06F 2200/1612* (2013.01)

(58) Field of Classification Search
CPC ... H05K 5/0017; H05K 5/0234; G06F 1/1671
See application file for complete search history.

(56) References Cited

U.S. PATENT DOCUMENTS

| | | | |
|---|---|---|---|
| 9,939,641 B1* | 4/2018 | Quiroz de la mora | ...................... B60K 35/00 |
| 10,178,209 B1* | 1/2019 | Hesse | ...................... H04M 1/04 |
| 10,288,880 B2* | 5/2019 | Nakayama | .............. F16C 11/04 |
| 2004/0027793 A1* | 2/2004 | Haraguchi | ............ G06F 1/1671 361/679.55 |

\* cited by examiner

*Primary Examiner* — Amy J. Sterling
(74) *Attorney, Agent, or Firm* — Hamre, Schumann, Mueller & Larson, P.C.

(57) ABSTRACT

A display apparatus includes a base unit, a monitor and a rotating member. The base unit includes a base seat, and a support member adapted to be in contact with a reference surface. The monitor is secured to the base unit. The rotating member is mounted to the base seat and has an annular surrounding surface surrounding a substantially-horizontal rotational axis, protruding outwardly of the top and bottom walls, and adapted to be in frictional contact with the reference surface. The rotating member is rotatable about the rotational axis to result in rotation of the base seat about the support member relative to the reference surface.

3 Claims, 4 Drawing Sheets

DISPLAY APPARATUS

CROSS-REFERENCE TO RELATED APPLICATION

This application claims priority of Taiwanese Invention Patent Application No. 108145986, filed on Dec. 16, 2019.

FIELD

The disclosure relates to a display apparatus, more particularly to a rotatable display apparatus.

BACKGROUND

In modern life, almost every household has a monitor such as a computer monitor or a television. When a user is positioned at an angle to the normal of the monitor, in order to clearly see the image displayed by the monitor, the user may wish to turn the monitor to face themselves. However, some monitors may be large and heavy, and thus difficult to move. Moreover, as some monitors have no frames around the screen, moving the monitor involves touching the screen which may leave fingerprints on or even damage the monitor.

SUMMARY

Therefore, the object of the disclosure is to provide a display apparatus that can alleviate at least one of the drawbacks of the prior art.

According to the disclosure, a display apparatus is adapted for being disposed on a reference surface. The display apparatus includes a base unit, a monitor and a rotating member.

The base unit includes a base seat having opposite top and bottom walls, and a support member adapted to be in contact with the reference surface. The bottom wall of the base seat is connected rotatably to the support member such that the base seat is rotatable about the support member relative to the reference surface.

The monitor is secured to the base unit and disposed above the top wall of the base unit.

The rotating member is mounted to the base seat and has an annular surrounding surface surrounding a substantially-horizontal rotational axis, protruding outwardly of the top and bottom walls, and adapted to be in frictional contact with the reference surface. The rotating member is rotatable about the rotational axis to result in rotation of the base seat about the support member relative to the reference surface.

BRIEF DESCRIPTION OF THE DRAWINGS

Other features and advantages of the disclosure will become apparent in the following detailed description of the embodiment with reference to the accompanying drawings, of which.

DETAILED DESCRIPTION

To aid in describing the disclosure, directional terms may be used in the specification and claims to describe portions of the present disclosure (e.g., front, rear, left, right, top, bottom, etc.). These directional definitions are intended to merely assist in describing and claiming the disclosure and are not intended to limit the disclosure in any way.

Figure 1:
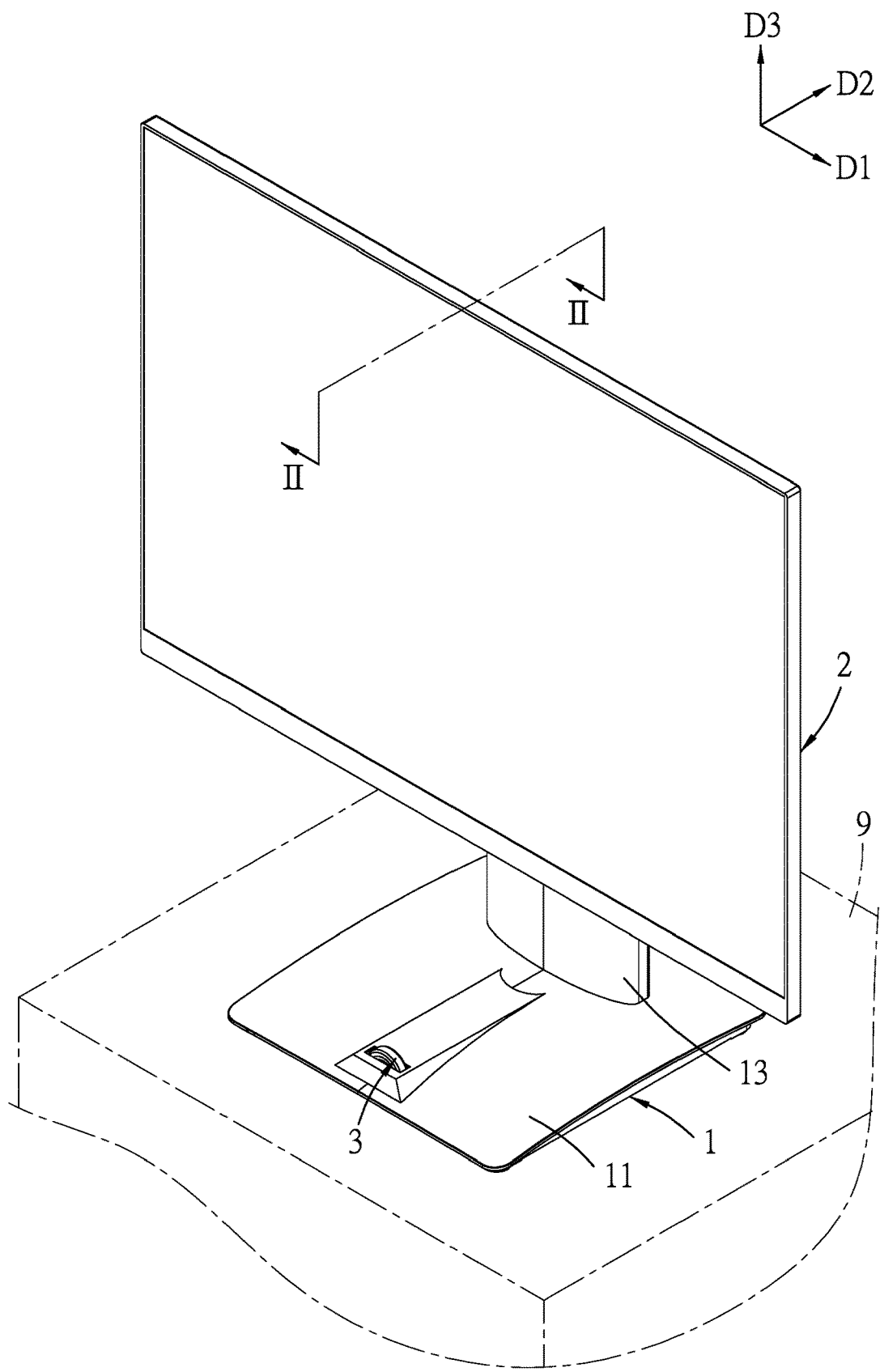
FIG. 1 is a perspective view of an embodiment of a display apparatus according to the disclosure.
Figure 2:
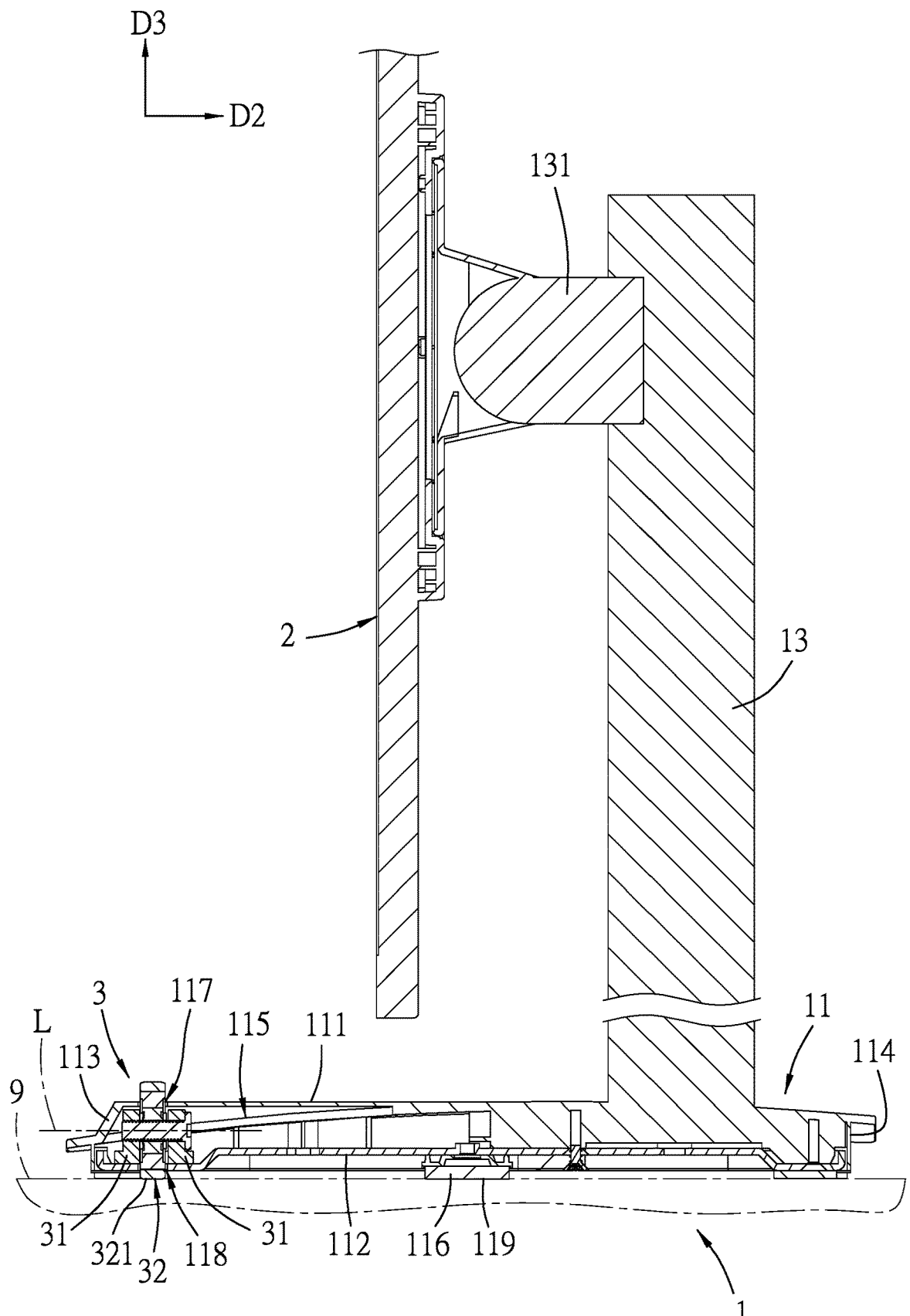
FIG. 2 is a fragmentary sectional view taken along line II-II in FIG. 1.

Referring to FIGS. 1 and 2, an embodiment of a display apparatus according to the disclosure is adapted for being disposed on a reference surface 9. The display apparatus includes a base unit 1, a monitor 2, and a rotating unit 3. In this embodiment, the display apparatus is a tabletop display and the reference surface 9 is a table surface.

The base unit 1 includes a base seat 11, a support member 116, and an upright frame 13. In this embodiment, the base seat 11 has a substantially rectangular shape when viewed from above and has opposite top and bottom walls 111, 112 defining a receiving space 115 therebetween, and opposite front and rear edges 113, 114 being elongated in a left-right direction (D1), spaced apart in a front-rear direction (D2), and respectively proximal and distal to a user. The top wall 111 is formed with a top through hole 117 extending therethrough to communicate with the receiving space 115 and disposed proximal to the front edge 113. The bottom wall 112 is formed with a bottom through hole 118 extending therethrough to communicate with the receiving space 115 and disposed directly below the top through hole 117.

The support member 116 is center-aligned with the bottom wall 112 of the base seat 11, and has a top surface connected to the bottom wall 112, and an abutting surface 119 opposite to the bottom wall 112 of the base seat 11. The abutting surface 119 is circular and adapted for abutting against the reference surface 9. The bottom wall 112 of the base seat 11 is connected rotatably to the support member 116 such that the base seat 11 is rotatable about the support member 116 relative to the reference surface 9.

The upright frame 13 extends upward in an up-down direction (D3) from a portion of the top wall 111 which is proximal to the rear edge 114, and has a top end portion and a pivot mechanism 131 pivoted to the top end portion.

The monitor 2 is secured to the base unit 1 and disposed above the top wall 111 of the base unit 1. The monitor 2 has a front end proximal to the user, and a rear end opposite to the front end in the front-rear direction (D2) and secured to the pivot mechanism 131 of the upright frame 13 of the base unit 1 so that the monitor 2 may be tilted up or down.

The rotating unit 3 includes two securing members 31 and a rotating member 32 mounted to the base seat 11. The securing members 31 are secured to the base seat 11, disposed in the receiving space 115 adjacent to the top and bottom through holes 117, 118, and spaced apart in the front-rear direction (D2). The rotating member 32 is configured as a wheel clamped between the securing members 31 and has an annular surrounding surface 321 surrounding a substantially-horizontal rotational axis (L) that extends in the front-rear direction (D2). The rotating member 32 protrudes outwardly of the top and bottom walls 111, 112, and is adapted to be in frictional contact with the reference surface 9. Specifically, the rotating member 32 extends through the top and bottom holes 117, 118 and is secured rotatably at this position by the securing members 31.

Figure 3:
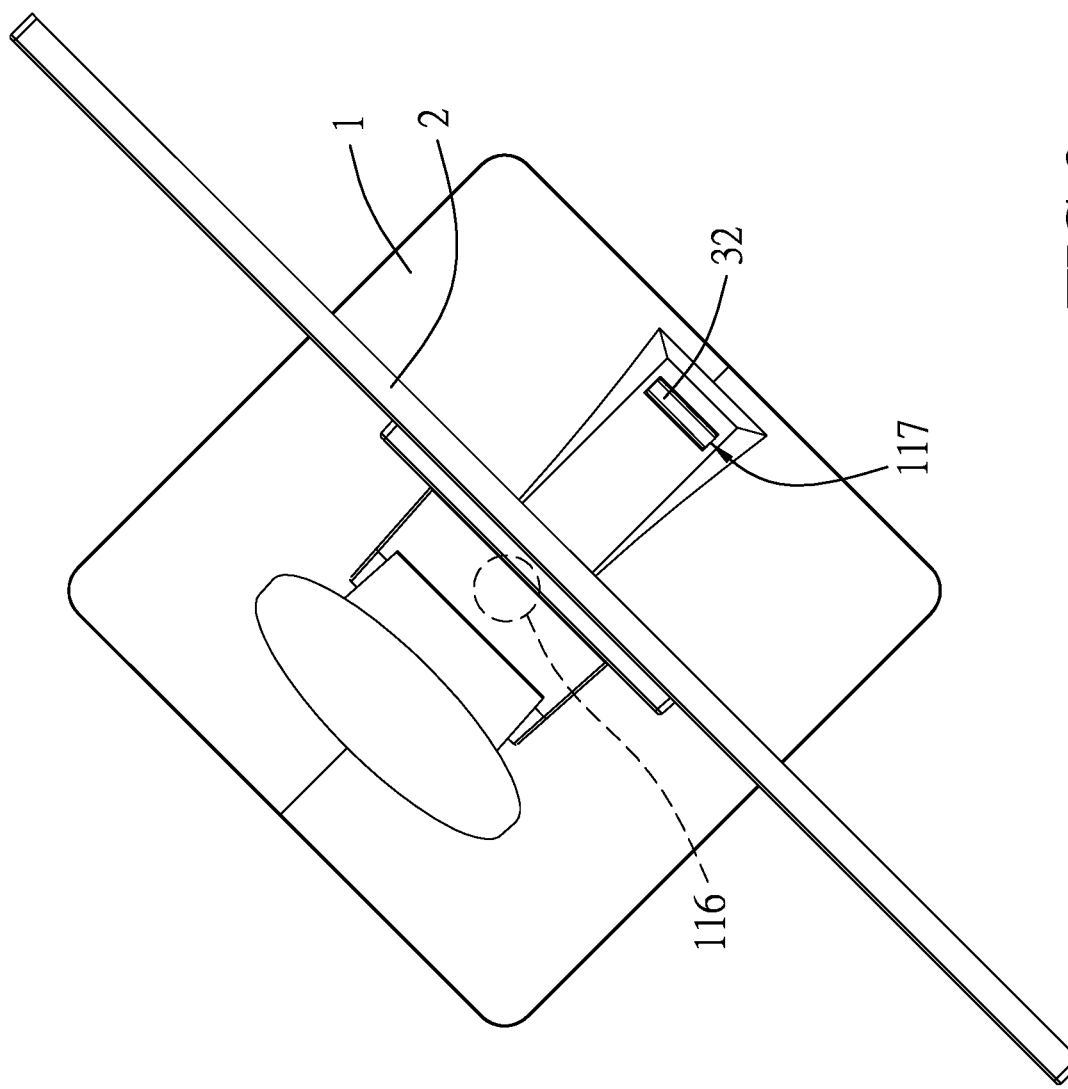
FIG. 3 is a top view of the embodiment illustrating a monitor of the embodiment rotated in one direction.
Figure 4:
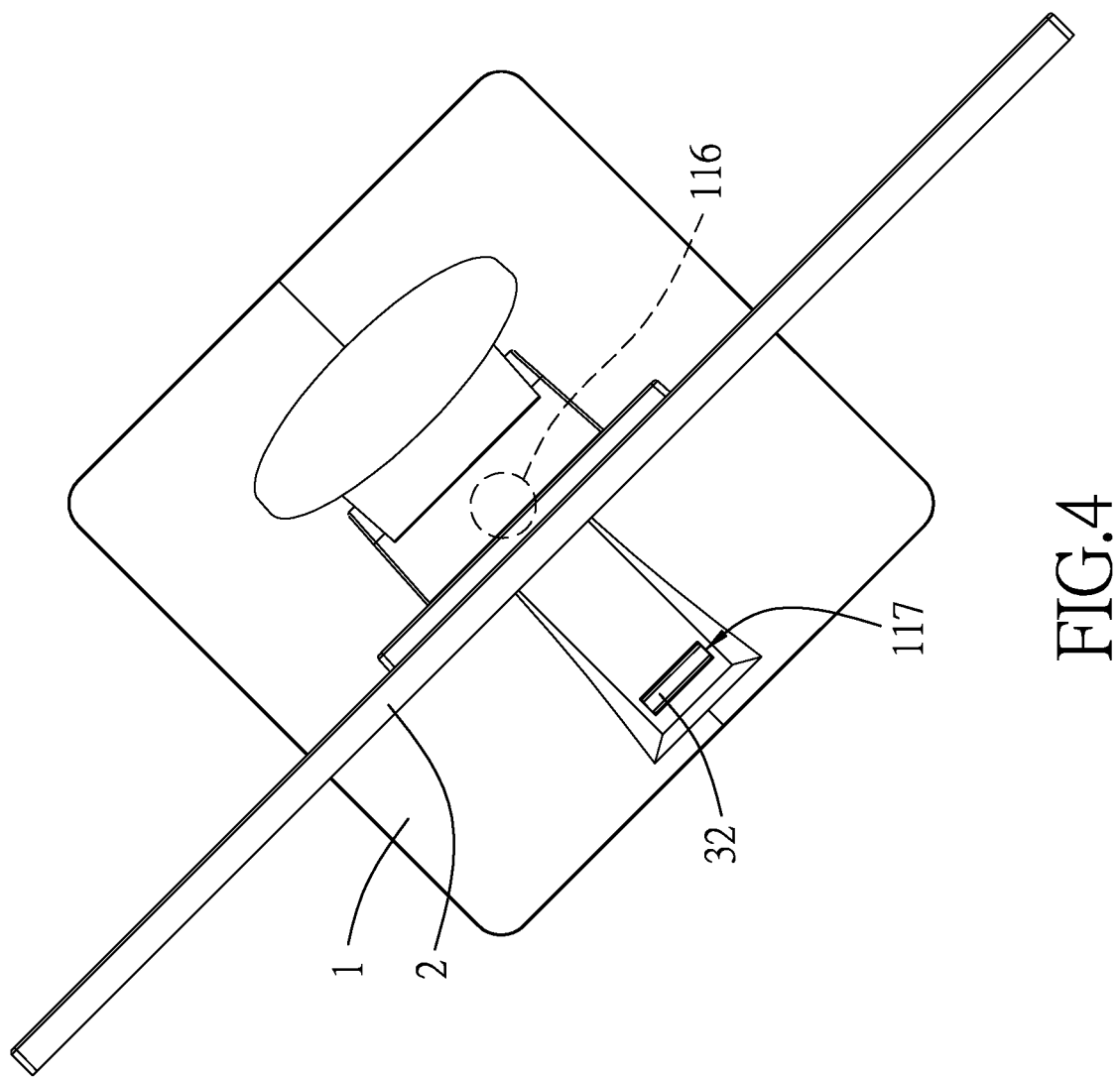
FIG. 4 is top view of the embodiment illustrating the monitor rotated in another direction.

Referring to FIGS. 2, 3 and 4, the rotating member 32, when being operated at a portion thereof that extends through the top holes 117, is rotatable about the rotational axis (L) to result in rotation of the base seat 11 about the support member 116 relative to the reference surface 9, and the rotation of the base unit 11 drives the monitor 2, which is secured to the base seat 11 through the upright frame 13, to co-rotate with the base seat 11. For example, by rotating the rotating member 32 in a clockwise direction when viewed from the front edge 113, the base seat 11 and the monitor 2 are brought to rotate to the right (see FIG. 3). Conversely, when the rotating member 32 is rotated in an anticlockwise direction, the base seat 11 and the monitor 2 are brought to rotate to the left (FIG. 4).

The advantages of the display apparatus of this disclosure lie in that the monitor 2 may be rotated conveniently by operation of the rotating member 32, that is, the user does not need to lift and move the monitor 2 nor directly handle the monitor 2 which may leave fingerprints on or damage the monitor 2.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A display apparatus adapted for being disposed on a reference surface, said display apparatus comprising:
   a base unit including
      a base seat that has opposite top and bottom walls, and
      a support member that is adapted to be in contact with the reference surface, said bottom wall of said base seat being connected rotatably to said support member such that said base seat is rotatable about said support member relative to the reference surface;
   a monitor secured to said base unit and disposed above said top wall of said base unit; and
   a rotating member mounted to said base seat and having an annular surrounding surface that surrounds a substantially-horizontal rotational axis, that protrudes outwardly of said top and bottom walls, and that is adapted to be in frictional contact with the reference surface, said rotating member being rotatable about the rotational axis to result in rotation of said base seat about said support member relative to the reference surface.

2. The display apparatus as claimed in claim 1, wherein:
   said monitor has a front end, and a rear end opposite to said front end in a front-rear direction and secured to said base unit; and
   said display apparatus further comprises two securing members secured to said base seat and spaced apart in the front-rear direction; and
   said rotating member is configured as a wheel clamped between said securing members with the rotational axis extending in the front-rear direction.

3. The display apparatus as claimed in claim 1, wherein said supporting portion has an abutting surface opposite to said bottom wall of said base seat, said abutting surface being circular and being adapted for abutting against the reference surface.

* * * * *